United States Patent [19]
Gustafson

[11] Patent Number: 5,879,502
[45] Date of Patent: Mar. 9, 1999

[54] METHOD FOR MAKING AN ELECTRONIC MODULE AND ELECTRONIC MODULE OBTAINED ACCORDING TO THE METHOD

[76] Inventor: Ake Gustafson, Route Champ Thomas, 1618 Châtel-St-Denis, Switzerland

[21] Appl. No.: 737,410
[22] PCT Filed: May 29, 1995
[86] PCT No.: PCT/EP95/02038
  § 371 Date: Nov. 12, 1996
  § 102(e) Date: Nov. 12, 1996
[87] PCT Pub. No.: WO95/33246
  PCT Pub. Date: Dec. 7, 1995

[30] Foreign Application Priority Data

May 27, 1994 [EP] European Pat. Off. .............. 94810312

[51] Int. Cl.⁶ .......................... H01L 23/29; H01L 21/64; B32B 31/12; B32B 3/10
[52] U.S. Cl. .................... 156/292; 156/298; 156/303.1; 156/307.3; 156/307.7; 156/310; 174/258; 174/259; 264/272.13; 264/272.17; 264/279.1; 361/737
[58] Field of Search .................... 156/150, 290, 156/293, 298, 307.3, 300, 307.7, 309.6, 303.1, 295, 292, 288, 310; 29/829, 830, 841; 361/737; 174/258, 259, 260; 264/272.13, 272.17, 279.1

[56] References Cited

U.S. PATENT DOCUMENTS

| | | | |
|---|---|---|---|
| 2,955,974 | 10/1960 | Allen et al. | 442/236 |
| 3,600,263 | 8/1971 | Lapitz | 442/236 |
| 3,940,534 | 2/1976 | Fick et al. | 442/281 |
| 4,617,216 | 10/1986 | Haghiri-Tehrani et al. | 428/67 |

FOREIGN PATENT DOCUMENTS

| | | |
|---|---|---|
| A-0128822 | 12/1984 | European Pat. Off. . |
| A-0197847 | 10/1986 | European Pat. Off. . |
| A-0326822 | 8/1989 | European Pat. Off. . |
| WO 92-15105 | 9/1992 | European Pat. Off. . |
| A-2660092 | 9/1991 | France . |
| A-60-227406 | 12/1985 | Japan . |
| A-2081644 | 2/1982 | United Kingdom . |
| 90/12668 | 11/1990 | WIPO . |

*Primary Examiner*—Francis J. Lorin
*Attorney, Agent, or Firm*—Oliff & Berridge, PLC

[57] ABSTRACT

A method is described by which it is possible to obtain modules comprising a body of synthetic material, including an electronic circuit, having two main faces absolutely smooth and without swellings at the place where the circuit is enclosed in the body. The body includes two sheets having either an impregnating resin or a certain quantity of gas or air, the electronic circuit being disposed between the two sheets and these being pressed together at a predetermined temperature. A module is thus obtained having at least one electronic circuit which can include a coil serving as an antenna, the module being able to be cut in credit card format and being able to serve as an identification badge. The same method and the same substances can be used to make a module having an electronic circuit with a housing, contact tracks being flush on one of the main faces of the module. Composite modules having the two types of circuits can also be made using the same method.

31 Claims, 3 Drawing Sheets

METHOD FOR MAKING AN ELECTRONIC MODULE AND ELECTRONIC MODULE OBTAINED ACCORDING TO THE METHOD

BACKGROUND OF THE INVENTION

The contents of Application No. EP 94810312.2, filed on May 27, 1994, in Europe, is hereby incorporated by reference.

This invention relates, first of all, to a method for making an electronic module comprising an electronic circuit encapsulated or inset in a body of synthetic material, said body having two essentially flat and parallel main faces, and said module cut according to a predetermined format, in particular in the format of a credit card.

For some years now there have been numerous applications of electronic modules in credit card format having two main faces, i.e. two faces whose dimensions are markedly larger than one of the dimensions (thickness of the card) of the other faces, it being hoped that the two said main faces are preferably flat and parallel, and are equipped with an electronic component including in particular electronic memory means provided with a code, connected to an antenna, such as, for example, the transponder or electronic circuit which can be queried at a distance by inductive means, shown in FIG. 7 of the application EP-A-0 573 469. Such modules can be used, for example, as identification badges.

Other applications require being able to have access to one or more contact tracks disposed generally flush with one of the main faces of the module, said tracks being connected permanently to an electronic circuit disposed inside the module, in order to be able to exchange data with a suitable electronic device equipped also with means permitting contact to be established with the contact track or tracks of the module. Modules of this type are used, for example, as telephone debit cards.

A module equipped with two types of mentioned circuits, either a first access circuit by means of contact tracks and a second access circuit by inductive means allows, in particular, increasing the security of use of the debit or credit card.

Various methods exist for encapsulating an electronic component, with or without coil forming transmitting and receiving antenna such as in the case of the previously mentioned application, inside or on the surface of a body of synthetic material in order to protect it from humidity, from dust and mechanical constraints, said body having in the end a credit card format or any other convenient format so that the device can be easily handled.

A first possibility consists in injecting a thermoformable material around the electronic component; this method requires a costly injection tool and involves difficulties in placing the electronic component correctly inside the body. Moreover, in cases where the electronic component is connected to another component or to a coil, the great pressure exercised by the injected substance can break the very fine wires connecting these elements.

According to another method, the component is disposed between two thermoplastic sheets which are then laminated; even though said component has a sufficiently small thickness, generally less than 0.5 mm, it is difficult to obtain a card having two absolutely flat and parallel faces, a slight swelling always remaining at the location where the component is disposed. To overcome this drawback, it is proposed that, first of all, the component be disposed on the inside of a cutting made in one thermoplastic sheet of a thickness approximately equal to that of the component, then this assembly be laminated between two other thermoplastic sheets. Because of its complexity, this last method is ultimately costly, and moreover, owing to the required dimensional tolerances between the cutting and the dimensions of the component, an empty region or line between these elements can be obtained, resulting ultimately in hollow regions or lines on the main faces of the body.

The application EP-A-0 128 822 presents a method by which an encapsulated electronic circuit, having at least one flat face provided with electrical contacts for subsequent access to a data read/write device is inset in a plate of plastic material, said plate being softened locally to permit insertion of the circuit inside the plate. A major drawback of this method is that the material making up the plate is not compressible and that a swelling is created on the plate's opposite face after the circuit has been inserted, a swelling which requires at least one subsequent operation for its elimination. In another embodiment of the method, a hollow accommodation is provided in the plate for introducing the circuit, the hollow space remaining in the plate after introduction of the circuit being then filled with a filling material. This method is ultimately rather complex, requiring a number of operations, the presence of several materials and creating several transition surfaces between materials.

The application EP-A-0 570 784 describes a manufacturing process where an accommodation is first made in a plate which will then be used as a positioning structure for the electronic circuit. The bonding material in liquid form is then introduced in order to impregnate the plate before pressing. The use of a volatile liquid is a drawback in a manufacturing process since it generally requires large ventilating means. The use of a bonding material in solid form, as is proposed as a variant, requires disposing more layers before pressing. Therefore this metho d also requires supplementary operations, preparation of the accommodation, introduction of the bonding material, and as with all the methods foreseeing an accommodation for the electronic circuit, it can be difficult to ensure a perfect surface evenness of the main faces of the module. Moreover this method is less versatile since it does not allow modules to be manufactured having a circuit whose contact surfaces are flush with one of the faces of the module.

Another drawback of prior art methods is that they call for rather flexible materials, the body remaining flexible when the module is completed. This can be a drawback when the electronic circuit carries a component, in particular a coil of relatively large dimensions; by bending the module it is easily possible to break the coil.

A first object of the invention is thus to propose a method of encapsulating an electronic circuit including at least one electronic component in or on the surface of a body of synthetic material having the shape of a plate, and preferably the dimensions of a credit card, and not having the mentioned drawbacks of the prior art, but permitting a module to be obtained whose two main faces are absolutely flat and parallel, this by inexpensive, easy-to-use means and without it being necessary to precut the sheet or sheets forming the body.

Another object of the invention is to propose an electronic module such as is described above, which does not have the mentioned drawbacks of known modules since it has been made by means of the method according to the invention.

The different objects are attained through different variant embodiments of the method calling for different starting materials all having similar thermal and mechanical characteristics, allowing modules to be obtained according to several configurations of electronic circuits and answering to the features of claims 1 to 20, as well as an electronic module such as is described in claims 21 to 24.

The invention is described more closely below with reference to the attached drawing containing the figures in which.

The invention is realized in particular by using special materials to form the plates of the body; these materials are characterized by the fact that they are compressible when they are subjected to heating and remain in compressed form after cooling. To this end, two types of materials can be used, a first type consisting of a material pre-impregnated with a resin and a second type consisting of a material containing a certain volume of gas or air. Each of these types of materials can comprise several variants of substances.

Figure 1A:
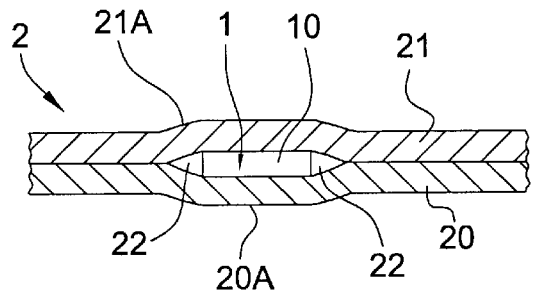
FIGS. 1A and 1B show sectional views in greatly enlarged scale of portions of electronic modules made according to one of the methods described by the prior art.
Figure 1B:
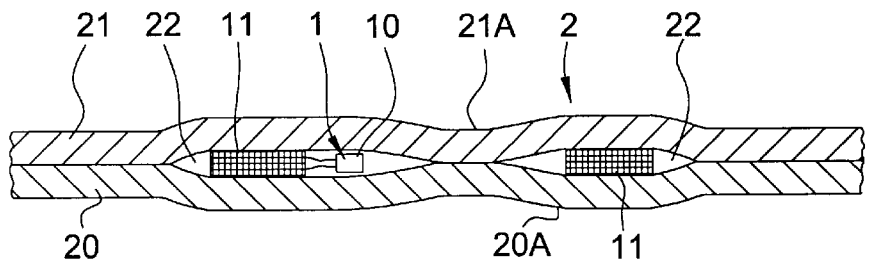

In FIG. 1A, which shows one embodiment of the prior art, the electronic circuit 1 comprises a single component 10, for example an encapsulated integrated circuit. The body 2 comprises two sheets of synthetic material 20 and 21 which have been laminated around the component 10. It is to be noted that, owing to the low deformability of sheets 20 and 21, there remains an empty space 22 on the entire circumference of the component 10; despite the great pressure applied in lamination; moreover, and for the same reasons as above, even though the thickness of sheets 20 and 21 remains approximately constant on the entire body 2, a slight swelling can be observed on the portions of the surface 21A and 22A of the body 2 near component 10. The same effect is visible in FIG. 1B where the electronic circuit 1 is made up here of the component 10, an integrated circuit for example, connected to a coil 11 in the shape of a torus. Such electronic circuits are shown schematically in FIG. 9. In this case, it is seen that that an empty space 22 remains also inside the torus 11 and that consequently the swelling involves larger portions of surface 21A and 20A of body 2.

Figure 2:
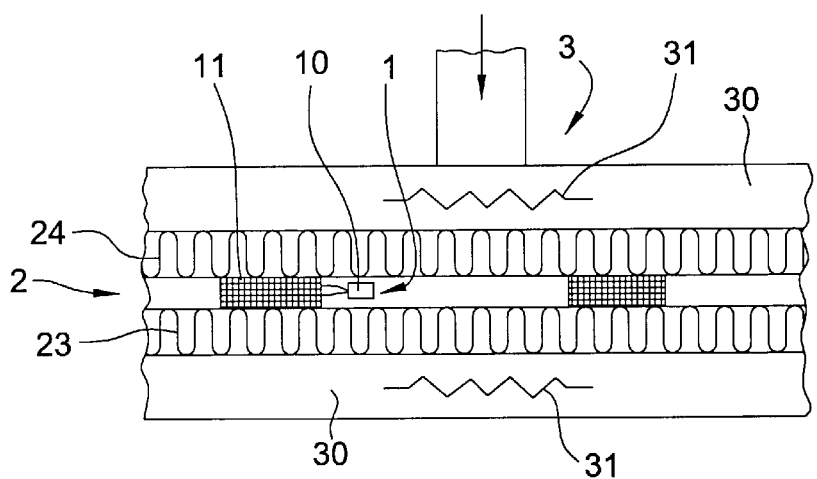
FIG. 2 shows a sectional view of a portion of an electronic module in the course of manufacture according to the method of the invention, before pressing of the two sheets of a first type of material subsequently forming the body.
Figure 3:
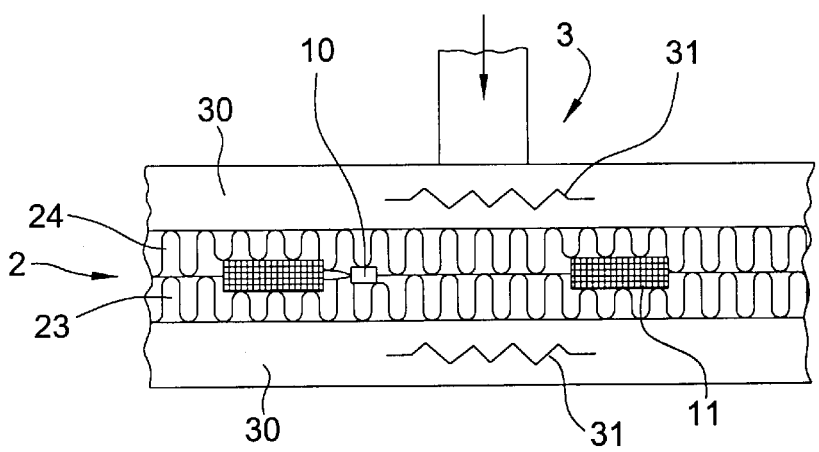
FIG. 3 shows the same module after pressing of the two sheets forming the body.

FIG. 2 shows the first stage of manufacture of an electronic module according to the method of the invention, using a material of the first type described above. One has, for example, the same electronic circuit 1 comprising a component 10 and a coil 11, seen in section. The electronic circuit 1 is disposed between two sheets 23 and 24, composed of a substance pre-impregnated with a resin. The two sheets 23 and 24 are made up of a woven or non-woven substance, preferably fiberglass-based or with a base of any other suitable material such as polyester, pre-impregnated with a resine, typically an epoxy resin, in such a way that if the sheets 23 and 24 are hard and sufficiently rigid at ambient temperature, the resin must become more fluid when the temperature is raised, the sheets then having to be relatively soft and deformable. After becoming fluid, this resin is able to polymerize, either directly under the action of the temperature, or when another suitable additive is added to it. The total thickness of the two sheets 23 and 24 is approximately equal to the desired thickness of the body 2 in completed state, the two sheets being preferably of the same thickness. As can be seen in FIG. 2, the two sheets 23 and 24 are placed in pressing/heating means 3 symbolized by the two flat and parallel plates 30 equipped with heating means symbolized by the resistors 31. It must be understood here that any suitable means of heating can be used, for example resistance heating, induction heating or circulation of a hot fluid. A low pressure, ranging between 0.05 and 1 kg/cm$^2$, preferably between 0.1 and 0.5 kg/cm$^2$, is applied by the plates 30, which are heated to bring the temperature of the sheets to a temperature ranging between 100° and 200° C., preferably between 130° and 150° C., depending mainly on the type of resin used. This first phase serves mainly to ensure a good thermal contact between the pressing plates 30 and the sheets 23 and 24 as well as to liquify the impregnating resin. The pressure is then increased to a value ranging between 0.5 and 10 kg/cm$^2$, preferably between 0.7 and 5 kg/cm$^2$, the previous temperature being maintained during this second phase, the sheets 23 and 24 being kept under these conditions for between 5 and 30 minutes. During this second phase of the method, the impregnating resin completely liquified during the first phase will always tend to flow, under the effect of the pressure applied, from a place of high pressure toward a place of lower pressure, then afterwards it will polymerize. Referring to FIG. 2, the maximum pressure is thus applied to places where the sheets 23 and 24 are directly in contact with a portion of the electronic circuit 1; the liquid resin will therefore flow laterally from those places toward places of lower pressure, for example toward the center or the outside of coil 11. In view of the duration in which the pressure is applied, the material forming the base of sheets 23 and 24 is slightly compressed at the places where the sheets are in contact with the electronic circuit and molds the contours of the circuit, without allowing empty spaces, until the two faces facing the sheets come into contact with the places not in contact with the electronic circuit; this step of the method is shown in FIG. 3. At this moment the liquid has distributed itself uniformly over the entire body 2, then has started to polymerize, either directly under the action of the temperature or with the aid of an additive, and then it is only necessary to separate the pressing/heating plates 30 to obtain a rigid body 2 containing an electronic circuit 1. According to the type of resin used, either a substance of the hard plastic type is obtained which, after polymerization, is rigid at high temperature and for which it is not necessary to carry out a special cooling phase, or a substance of the thermoplastic type for which it is necessary to conduct a controlled cooling phase, before it leaves the pressing/heating plates.

According to a variant of the method, it is possible to do without the first step, serving to ensure the good thermal contact, by applying the more elevated pressure directly, that ranging between 0.5 and 10 kg/cm$^2$, at a temperature between 100° and 200° C.

Figure 4:
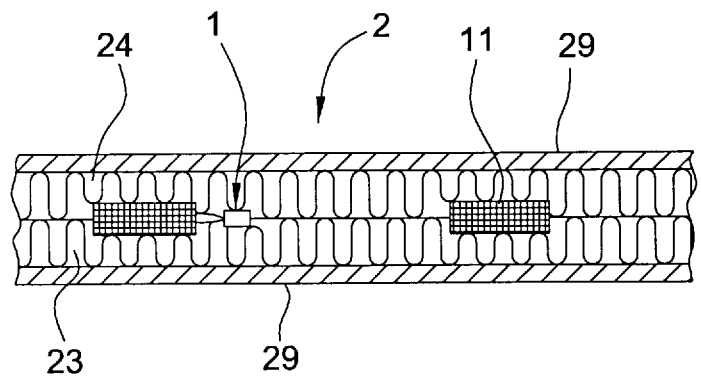
FIG. 4 shows the same module completed.

After withdrawal of the pressure plates 30, the device is as shown in FIG. 4, where it can be seen that the two sheets 23 and 24 have surrounded completely the circuit 1, as a rule, not leaving any empty space. This has been possible because of the capability of the sheets 23 and 24 to be deformed and to mold to the contour of the circuit 1 under the effect of the temperature and of the pressure applied, this deformation remaining after removal of the pressure. In this way the two main external faces of the body 2 are absolutely flat and parallel, without swelling. Depending upon the uses, it is also possible to dispose at least one more external layer 29 on one or on both main faces of the body 2. This layer or these layers could be applied originally to the sheets 23 and/or 24, or otherwise applied to the finished body by lamination or by any other suitable method. An impression or printing can then be applied to one or both of the two main faces of the module.

In a variant of the first type of substance previously described, one can also have sheets 23 and 24 made of polyester fiber-based felt or of a foam pre-impregnated with a resin. Generally this substance is of the thermoplastic type, the sheets being relatively soft, even at low temperature, when the resin is not polymerized. The course of the manufacturing method for the modules is similar to that described above except that a reduction of thickness is imposed on the sheets 23 and 24 in order to bring the body 2 to the desired thickness as shown in FIGS. 3 and 4. Generally, when using substances of the thermoplastic type or made of a felt or a foam, the body 2 has micro-cavities after polymerization. One can then proceed to a supplementary impregnation of the body 2 with the aid of a substance of very low viscosity in order to improve the tightness of the body and/or increase its rigidity.

The method has been described using two sheets 23 and 24 of the same material and impregnated with the same resin. It is also possible to have a sheet 23 of a material impregnated with a first resin while the sheet 24, either made of the same material as sheet 23 or not, can be impregnated with another resin, for example a hardener which reacts with the first in order to carry out the polymerization.

Figure 5:
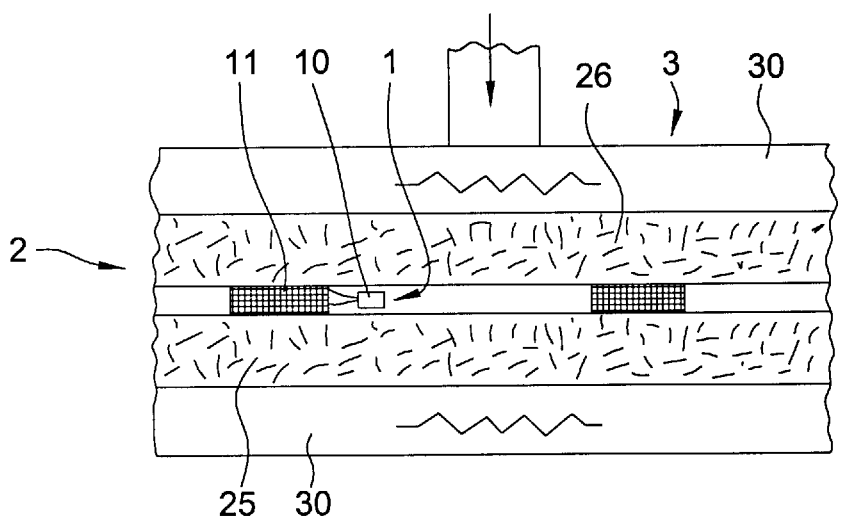
FIG. 5 shows a module at the same stage of manufacture as that of FIG. 2, but made with another type of sheets forming the body.

FIG. 5 illustrates the application of the method to sheets 25 and 26, made of a substance of the second type previously mentioned, a felt including a certain quantity of gas, preferably air. The felt is made of synthetic or natural fibers, each of the fibers being coated with a thermoplastic material, thus leaving a non-negligible quantity of air remaining between them. As can be seen in the figure, the circuit 1 is introduced between the two sheets 25 and 26 in the same way as previously; the sheets are placed in the pressing/heating device 3. Pressure is applied ranging between 1 and 5 kg/cm$^2$, preferably between 3 and 4 kg/cm$^2$, the temperature of the sheets being brought to a value ranging between 100° and 200° C., preferably between 120° and 140° C. The duration of this application of pressure under temperature can be 1 to 5 minutes, depending essentially upon the thermal capacity of plates 30. During this first phase of the method, the thermoplastic coatings of the fibers are caused to soften. A second phase of the method is then carried out, by applying a higher pressure, ranging between 2 and 10 kg/cm$^2$, preferably between 3 and 6 kg/cm$^2$, the plates being then cooled. The coating of the fibers being softened, the fibers can draw closer together during this phase, the air contained between them being then placed under pressure, the cooling intervening to solidify the fibers again by means of their coating, which is again hard, the total thickness of the two sheets 25 and 26 corresponding then to a desired value. The decrease of thickness of the sheets is very quick following the application of the higher pressure, this second phase of the method lasting between 10 and 30 seconds. The second phase of the method is carried out preferably on another press than that used for the first phase in view of the difficulty in cooling down quickly plates 30. The plates used for this second phase can be relatively heavy, so that they do not heat up too much when the hot sheets 25 and 26 are introduced, or otherwise they can include proper state-of-the-art cooling means. When the body 2, made up of the two sheets 25 and 26 put together, containing the electronic circuit 1, has left the second press, the body being cooled and rigid, the compressed air contained between the fibers can escape, owing to the interconnection of voids among the fibers, in a way so that normal pressure is re-established. The body 2 thus includes fibers more compressed in the proximity of circuit 1, and fibers less compressed in the rest of the body, but nevertheless has two absolutely flat and parallel main faces, without having any empty space in the vicinity of the circuit. As before, an operation of injection of a substance having a low viscosity can be carried out in order to fill in the voids between fibers. As a variant of, or as a complement to, this last operation, one or two flat faces of the body 2 can be covered with an exterior layer by means of lamination or by any other suitable process.

Figure 6:
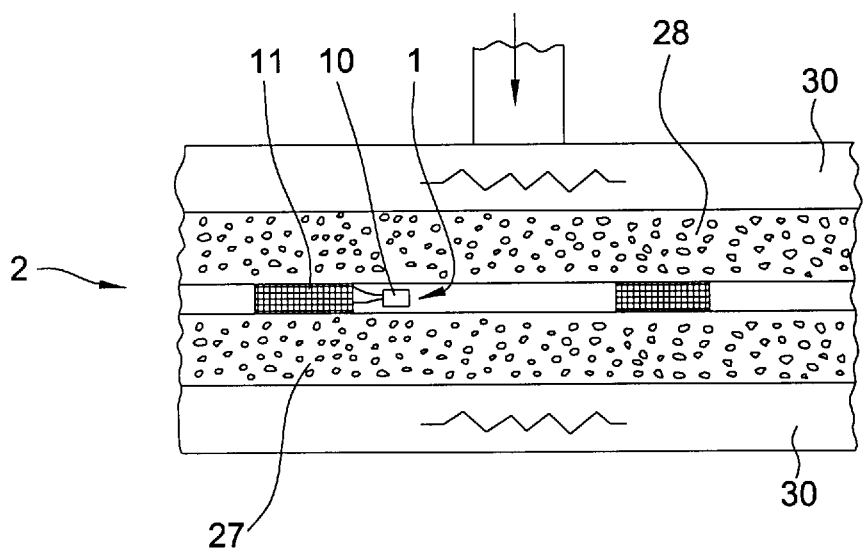
FIG. 6 shows a module at the same stage of manufacture as that of FIG. 2, but made with still another type of sheets forming the body.

The application of the method to another variant of the material of the previously mentioned second type is seen in FIG. 6. In this case, sheets 27 and 28 are made up of two sheets of expanded polystyrene, the volume of said sheets being composed of between 10 and 50%, preferably about 30%, gas or air bubbles contained in the polystyrene. When the two sheets 27 and 28 have been disposed one on top of the other, encompassing the circuit or circuits 1, a first pressure ranging between 1 and 5 kg/cm$^2$, preferably about 4 kg/cm$^2$, is applied by the plates 30 for a period of 30 seconds to 5 minutes, preferably for 1 minute, at a temperature of 100° to 200° C., preferably 120° to 130° C. During application of this first pressure at high temperature, the polyester softens. As before, a second phase is carried out, with an application of higher pressure, between 2 and 10 kg/cm$^2$, preferably about 5 kg/cm$^2$, plates 30 being then cooled. This second application of pressure, on the same pressing device or on another pressing device, allows the thickness of the two sheets 23 and 24 put together to be adjusted to a predetermined value by means of compression of the gas or air bubbles. After cooling, the closed bubbles remain under higher pressure, being maintained by the surrounding polystyrene. The internal pressure of the bubbles is higher at places near the circuit 1 than on the rest of the body. Considering that the gaseous bubbles are closed, the tightness of the body 2 is achieved without it being necessary to inject therein a substance of low viscosity. One or more external coatings can still be applied to the body.

The same materials as described above, used according to the corresponding methods, also allow modules to be obtained equipped with at least one electronic circuit mounted in a housing or encapsulated, of the type having at least one flat face on which there are one or more metallic tracks which are flush with one of the main surfaces of the module, subsequently allowing an exchange of data by establishing an electric contact of said tracks with a suitable electronic device.

Figure 7:
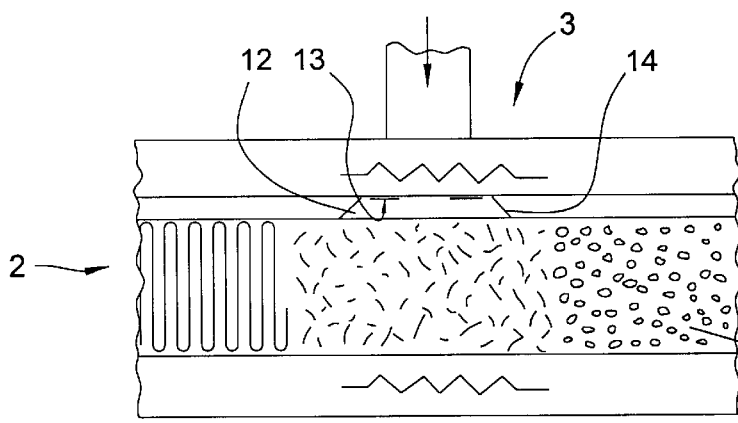
FIG. 7 shows another type of module in the course of manufacture.

FIG. 7 shows a sheet 24, 26 or 28 of one of the materials described above, on which a circuit housing 12 has been disposed including metallic tracks 13. The sheet and the housing are disposed in a pressing/heating device 3 and the operations of applying pressure and temperature are then carried out in the same way as above, according to the type of sheet 24, 26 or 28 foreseen, the housing 12 sinking then into the softened sheet until its flat upper surface including the metallic tracks 13 reaches the level of the upper surface of the sheet, the sheet having been brought to the desired thickness. The housing 12 preferably includes means of fastening to the body 2 in order to prevent expulsion of said housing in the case of bending of the module 2. The fastening means 14 are represented here by inclined lateral faces of the housing 12, such that when the material making up the sheet 24, 26 or 28 is softened, some of the material would come to surround and cover these inclined faces in order to block the housing 12 in position. Other retaining means can be provided, for example the formation of a groove on the lateral faces, such as described in the application EP-A-0 326 822 or otherwise by providing holes in the housing 12, said holes being filled with material upon the application of pressure, as described in the application EP-A-0 128 822. It is also possible to dispose an adhesive layer on the bottom of the housing 12, this adhesive layer keeping the housing in place.

Figure 8:
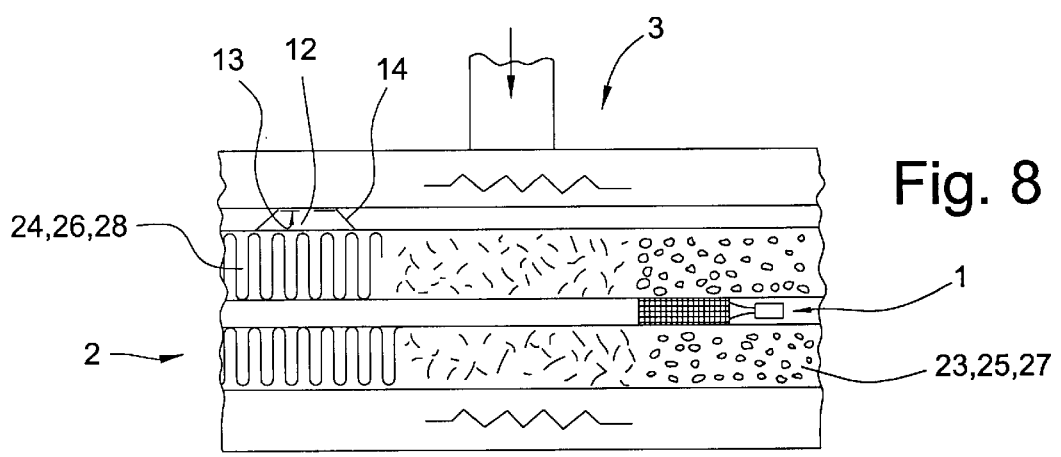
FIG. 8 shows still another type of module in the course of manufacture.

As seen in FIG. 8, it is also possible to combine on a single body 2 one or more circuits 1 enclosed between two sheets 23, 24; 25, 26; or 27, 28 composed of one or the other of the materials described above with one or more housings 12 whose metallic tracks must be flush with one of the main faces of the body 2. As before, the details of the manufacturing method are determined according to the material chosen for the sheets.

Figure 9:
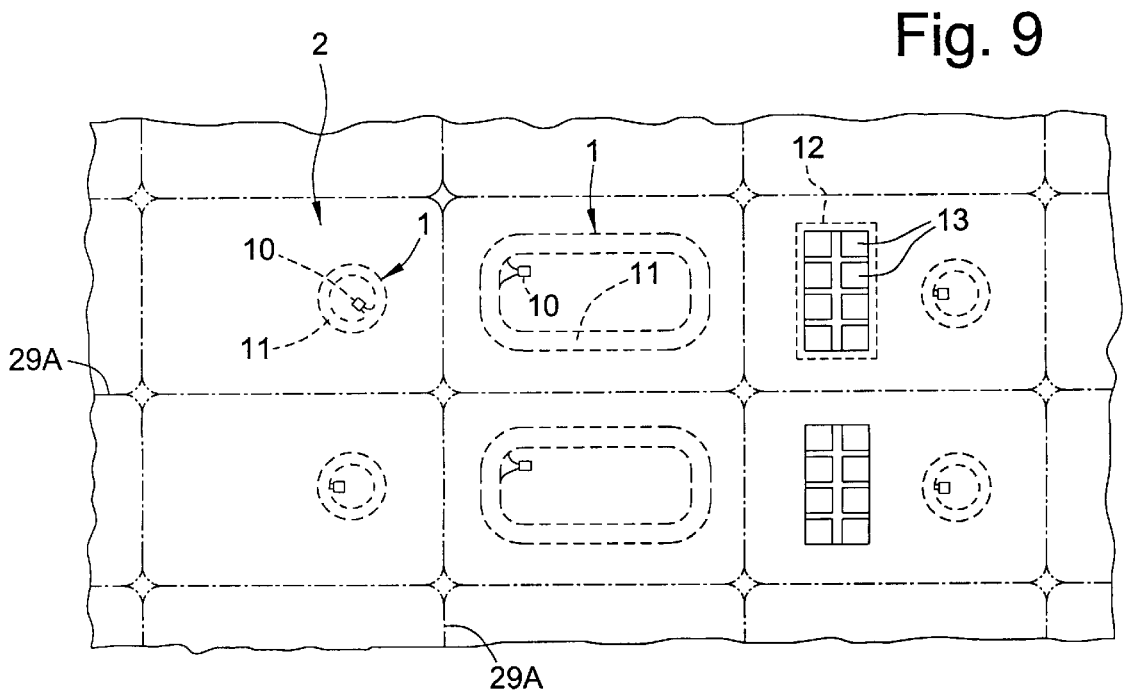
FIG. 9 shows a top plan view of a series of different types of modules in the course of manufacture.

To carry out one or the other of the methods described above, a plurality of circuits 1 is generally disposed on the bottom sheet 23, 25 or 27, the circuits 1 being regularly disposed, as seen in FIG. 9, according to a grid corresponding to the dimensions of modules or of bodies 2 such as will be subsequently cut. It is easy to dispose the circuits on the bottom sheet, manually or by mechanical, preferably automatic, means, considering that the upper surface of said sheet is slightly sticky owing to the presence of the resin with which it is impregnated. In the case where this surface is not sticky, a line of adhesive applied on said surface allows the circuits 1 to be maintained there. The upper sheet 24, 26 or 28 is then disposed, then the operations of pressing and polymerization or of hardening are carried out as previously described. A large rigid plate is thus obtained whose one or two faces have already been covered or can be covered with the supplementary layer or layers 29. A final operation consists in cutting this plate, along cutting lines 29A, using a known technique, for example with the aid of a fine jet of water under pressure, to the desired dimensions for each module, for example to the dimensions of a credit card (about 86×54 mm) or any other desired dimensions. The completed module can include just a single electronic circuit 1 or a plurality of identical or different circuits, which can possibly be connected to each other. The left portion of the figure shows circuits 1 including in particular a component 10 connected to a coil of circular shape 11, whereas in the central portion the coil is of different shape, and in the right portion it can be seen that housings 12 have been added; it is evident that a plate in this stage of manufacture preferably has just a single type of circuit or combination of circuits, three types having been shown here on the same plate by way of illustration.

Instead of a plate as indicated above, it is also possible to provide the sheets 23, 24; 25, 26; 27, 28 in the form of strips, the circuits being disposed in line on these strips or otherwise each sheet can be pre-cut to the desired format for the module 2, before being introduced in the pressing device, it being even possible, as a variant, that the pressing device is equipped directly with cutting means allowing the cut to be made in the desired format while the sheets are in the soft state.

The pressing operations described above, for one or the other materials foreseen, can be carried out using a device disposed under ambiant pressure or otherwise mounted in a tight enclosure in which a higher or lower vacuum is created or otherwise an inflation with a neutral gas. Likewise, instead of pressing plates, the pressure can be applied by roller means in the one or the other of the manufacturing stages described.

Thus, by means of the materials proposed, each used in relation to the corresponding method, it is possible to obtain a module of any dimensions including one or more electronic circuits and having two absolutely flat and parallel main faces. Another advantage coming from the materials used, in particular from their rigidity after pressing or polymerization, is that the electronic circuit or circuits are well covered in a rigid material, which ensures efficient mechanical protection, in particular, for example, for the circuits having a coil of large dimension.

I claim:

1. A method of making an electronic module comprising at least one electronic circuit encapsulated in a body of synthetic material, the body having two essentially flat and parallel main faces, wherein at least one electronic circuit is disposed on a first sheet in a first material pre-impregnated with a first impregnating substance, a second sheet in a second material pre-impregnated with a second impregnating substance being disposed above the first sheet and the electronic circuit or circuits; the sheets being made of a heat-deformable material are then subjected to a pressure according to a predetermined value accompanied by a heating to a predetermined temperature, leading to the deformation of the sheets and to the liquefaction of the impregnating substances, the encapsulation of the electronic circuit or circuits between the two compressed sheets being obtained at the time of rigidification of the two sheets at the time of polymerization of the impregnating substances.

2. The method according to claim 1, wherein the application of the pressure at a predetermined value is preceded by another application of pressure, of a lower value, accompanied by the same heating at the same predetermined temperature.

3. The method according to claim 2, wherein at the time of another application of pressure, the pressure ranges between 0.05 kg/cm$^2$ and 1 kg/cm$^2$.

4. The method according to claim 1, wherein the sheets are made of the same material, a woven or non-woven material, of the felt type or foam type.

5. The method according to claim 4, wherein the first impregnating substance is a resin and the second impregnating substance is a hardening agent.

6. The method according to claim 4, wherein the first impregnating substance and the second impregnating substance are alike.

7. The method according to claim 1, wherein the predetermined pressure ranges between 0.5 kg/cm$^2$ and 10 kg/cm$^2$ and the predetermined temperature ranges between 100° C. and 200° C.

8. The method according to claim 1, wherein the pressure application means comprise two flat and parallel plates equipped with heating/cooling means.

9. The method according to claim 1, wherein an operation of impregnation of a substance with low viscosity is carried out after the cooling of the sheet or sheets.

10. The method according to claim 1, wherein at least one of the main faces of the module is coated with a supplementary coating of a synthetic material.

11. The method according to claim 1, wherein the rigid plate obtained after polymerization or hardening is then cut in modules according to a predetermined format, each of the modules having at least one electronic circuit.

12. An electronic module comprising a body of synthetic material having two essentially flat and parallel main faces and including at least one electronic circuit, the module being cut according to a predetermined format, the module being made according to the method of claim 1, wherein the body is made from at least one sheet not having any cut or opening, the two flat and parallel faces of the body not having any swelling or roughness at the place where the circuit is disposed.

13. The electronic module according to claim 12, wherein at least one electronic circuit comprises an electronic component connected to a coil, the circuit being entirely encapsulated inside the body.

14. The electronic module according to claim 12, wherein at least one electronic circuit comprises a housing having a flat face provided with a contact track, the housing being inset in the body, the contact track or tracks being flush with one of the main faces.

15. The electronic module according to claim 14, wherein the housing includes attaching means permitting its fixation in the body.

16. A method of making an electronic module comprising at least one electronic circuit disposed in a housing, inset in a body of synthetic material, the body having two essentially flat and parallel main faces, the housing having a flat face including at least one contact track, the contact track being flush with one of the main faces of the body, wherein at least one housing with electronic circuit is disposed on a sheet of a material pre-impreynated with an impregnating substance, the sheet being made of a heat-deformable material, the face of the housing or housings with electronic circuit or circuits opposite the face including the contact track or tracks being turned toward the sheet; the housing or housings and the sheet are then subjected to a pressure according to a predetermined value accompanied by a heating to a predetermined temperature leading to the deformation of the sheet and a liquefaction of the impregnating substance, the insetting of the housing or housings in the compressed sheet being obtained at the time of rigidification of the sheet at the time of polymerization of the impregnating substance.

17. A method of making an electronic module comprising at least one electronic circuit encapsulated in a body of synthetic material, the body having two essentially flat and parallel main faces, and at least one other electronic circuit disposed in a housing, inset in the body of synthetic material, the housing having a flat face including at least one contact track, the contact track being flush with one of the main faces of the body, wherein at least one electronic circuit is disposed on a first sheet in a first material pre-impregnated with a first impregnating substance, a second sheet in a second material pre-impregnated with a second impregnating substance being disposed above the first sheet and the electronic circuit or circuits, at least one housing is disposed on one of the sheets, the face of the housing or housings opposite the face including the contact track or tracks being turned toward the one sheet; the sheets being made of a heat-deformable material are then subjected to a pressure according to a predetermined value accompanied by a heating to a predetermined temperature, leading to the deformation of the sheets and to the liquefaction of the impregnating substances, the encapsulation of the electronic circuit or circuits between the two compressed sheets and the insetting of the housing in one of the sheets being obtained at the time of rigidification of the sheets at the time of polymerization of the impregnating substances.

18. A method of making an electronic module comprising at least one electronic circuit encapsulated in a body of synthetic material, the body having two essentially flat and parallel main faces, wherein at least one electronic circuit is disposed on a first sheet in a material compressible at least by heat comprising a thermoplastic material including a certain quantity of bubbles of enclosed air or gas, a second sheet of the same material being disposed above the first sheet and the electronic circuit or circuits; the sheets are then subjected to a first pressure according to a first predetermined value, accompanied by a heating to a predetermined temperature causing a softening of at least a part of the material constituting the sheets, then a second pressure according to a second predetermined value accompanied by a cooling, the second pressure causing a compression of the bubbles respectively of the sheets of the material, the cooling causing the hardening of the material in the compressed state and the encapsulation of the electronic circuit or circuits between the two sheets.

19. The method according to claim 18, wherein the first pressure ranges between 1 kg/cm$^2$ and 5 kg/cm$^2$, the first temperature ranges between 100° C. and 200° C., and the second pressure ranges between 1 kg/cm$^2$ and 10 kg/cm$^2$.

20. The method according to claim 19, wherein the first application of pressure and the second application of pressure are carried out by different pressure application means.

21. A method of making an electronic module comprising at least one electronic circuit disposed in a housing, inset in a body of synthetic material, the body having two essentially flat and parallel main faces, the housing having a flat face including al least one contact track, the contact track being flush with one of the main faces of the body, wherein at least one housing is disposed on a sheet in a material compressible at least by heat comprising a thermoplastic material including a certain quantity of bubbles of enclosed air or gas, the face of the housing or housings opposite the face including the contact track or tracks being turned toward the sheet, the housing or housings and the sheet being then subjected to a first pressure according to a predetermined value, accompanied by a heating to a predetermined temperature, causing a softening of at least a part of the material constituting the sheet, then a second pressure according to a second predetermined value accompanied by a cooling, the second pressure causing a compression of the bubbles, respectively of the sheet of the material, the cooling causing the hardening of the material in the compressed state and the insetting of the housing or housings in the sheet.

22. A method of making an electronic module comprising at least one electronic circuit encapsulated in a body of synthetic material, the body having two essentially flat and parallel main faces, and at least one other electronic circuit disposed in a housing, inset in the body of synthetic material, the housing having a flat face including at least one contact track, the contact track being flush with one of the main faces of the body, wherein at least one electronic circuit is disposed on a first sheet in a material compressible at least by heat comprising a thermoplastic material including a certain quantity of bubbles of enclosed air or gas, a second sheet of the same material being disposed above the first sheet and the electronic circuit or circuits, at least one housing is disposed on one of the sheets, the face of the housing or housings opposite the face including the contact track or tracks being turned toward the sheet; the sheets are then subjected to a first pressure according to a first predetermined value, accompanied by a heating to a predetermined temperature, causing a softening of at least a part of the material making up the sheets, then a second pressure according to a second predetermined value accompanied by a cooling, the second pressure causing a compression of the bubbles, respectively of the material of the sheets, the cooling causing the hardening of the material in the compressed state and the encapsulation of the electronic circuit or circuits between the two sheets as well as the insetting of the housing or housings in the one of the sheets.

23. A method of making an electronic module comprising at least one electronic circuit encapsulated in a body of synthetic material, the body having two essentially flat and parallel main faces, wherein at least one electronic circuit is disposed on a first sheet in a material compressible at least by heat comprising a felt made of synthetic or natural fibers coated with a thermoplastic material, a certain quantity of air being included between the fibers, a second sheet of the same material being disposed above the first sheet and the electronic circuit or circuits; the sheets are then subjected to a first pressure according to a first predetermined value, accompanied by a heating to a predetermined temperature causing a softening of the thermoplastic coatings of the fibers, then a second pressure according to a second predetermined value accompanied by a cooling, the second pressure causing a coming closer together of the fibers, as well as a compression of the enclosed air respectively of the sheets of the material, the cooling causing the hardening of the material in the compressed state and the encapsulation of the electronic circuit or circuits between the two sheets.

24. A method of making an electronic module comprising at least one electronic circuit disposed in a housing, inset in a body of synthetic material, the body having two essentially flat and parallel main faces, the housing having a flat face including at least one contact track, the contact track being flush with one of the main faces of the body, wherein at least one housing is disposed on a sheet in a material compressible at least by heat comprising a felt made of synthetic or natural fibers coated with a thermoplastic material, a certain quantity of air being included between the fibers, the face of the housing or housings opposite thereto including the contact track or tracks being turned toward the sheet, the housing or housings and the sheet being then subjected to a first pressure according to a predetermined value, accompanied by a heating to a predetermined temperature, causing a softening of the thermoplastic coatings of the fibers, then a second pressure according to a second predetermined value accompanied by a cooling, the second pressure causing a coming closer together of the fibers as well as a compression of the enclosed air, respectively of the sheet of the material, the cooling causing the hardening of the material in the compressed state and the insetting of the housing or housings in the sheet.

25. A method of making an electronic module comprising at least one electronic circuit encapsulated in a body of synthetic material, the body having two essentially flat and parallel main faces, and at least one other electronic circuit disposed in a housing, inset in the body of synthetic material, the housing having a flat face including at least one contact track, the contact track being flush with one of the main faces of the body, wherein at least one electronic circuit is disposed on a first sheet in a material compressible at least by heat comprising a felt made of synthetic or natural fibers coated with a thermoplastic material, a certain quantity of air being enclosed between the fibers, a second sheet of the same material being disposed above the first sheet and the electronic circuit or circuits, at least one housing is disposed on the one of the sheets, the face of the housing or housings opposite the face including the contact track or tracks being turned toward the sheet; the sheets are then subjected to a first pressure according to a first predetermined value, accompanied by a heating to a predetermined temperature, causing a softening of the thermoplastic coatings of the fibers, then a second pressure according to a second predetermined value accompanied by a cooling, the second pressure causing a coming closer together of the fibers as well as a compression of the enclosed air, respectively of the sheets of the material, the cooling causing the hardening of the material in the compressed state and the encapsulation of the electronic circuit or circuits between the two sheets as well as the insetting of the housing or housings in the one of the sheets.

26. The method according to claim 7, wherein the predetermined pressure ranges between 0.7 kg/cm$^2$ and 5 kg/cm$^2$.

27. The method according to claim 7, wherein the predetermined temperature ranges between 130° C. and 150° C.

28. The method according to claim 19, wherein the first pressure ranges between 3 kg/cm$^2$ and 4 kg/cm$^2$.

29. The method according to claim 19, wherein the second pressure ranges between 3 kg/cm$^2$ and 6 kg/cm$^2$.

30. The method according to claim 11, wherein the predetermined format is a format of a credit card.

31. The method according to claim 12, wherein the predetermined format is a format of a credit card.

* * * * *